(12) United States Patent
Al et al.

(10) Patent No.: US 12,289,907 B2
(45) Date of Patent: Apr. 29, 2025

(54) VERTICAL INVERTER AND SEMICONDUCTOR DEVICE

(71) Applicant: WUHAN CHINA STAR OPTOELECTRONICS TECHNOLOGY CO., LTD., Wuhan (CN)

(72) Inventors: Fei Al, Wuhan (CN); Dewei Song, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 376 days.

(21) Appl. No.: 17/910,256

(22) PCT Filed: Aug. 30, 2022

(86) PCT No.: PCT/CN2022/115984
§ 371 (c)(1),
(2) Date: Sep. 8, 2022

(87) PCT Pub. No.: WO2024/031754
PCT Pub. Date: Feb. 15, 2024

(65) Prior Publication Data
US 2024/0055492 A1    Feb. 15, 2024

(30) Foreign Application Priority Data
Aug. 9, 2022 (CN) .................. 202210952412.X

(51) Int. Cl.
*H01L 29/417* (2006.01)
*H10D 30/67* (2025.01)
*H10K 59/121* (2023.01)

(52) U.S. Cl.
CPC ..... *H10D 30/6729* (2025.01); *H10D 30/6717* (2025.01); *H10D 30/6728* (2025.01); *H10D 30/6758* (2025.01); *H10K 59/1213* (2023.02)

(58) Field of Classification Search
CPC ......... H01L 29/41733; H01L 29/78603; H01L 29/78624; H01L 29/78642; H01L 27/124;
(Continued)

(56) References Cited

U.S. PATENT DOCUMENTS

| 6,808,971 B2* | 10/2004 | Bhattacharyya .... H01L 27/0688 438/222 |
| 2010/0207214 A1* | 8/2010 | Chuang ........... H01L 21/823814 257/E21.632 |
| 2013/0059434 A1* | 3/2013 | Yang .................... H01L 29/513 438/586 |

FOREIGN PATENT DOCUMENTS

| CN | 106298852 A | 1/2017 |
| CN | 107154407 A | 9/2017 |

(Continued)

OTHER PUBLICATIONS

PCT International Search Report for International Application No. PCT/CN2022/115984, mailed on Dec. 22, 2022, 8pp.
(Continued)

*Primary Examiner* — Mohammed R Alam
(74) *Attorney, Agent, or Firm* — The Roy Gross Law Firm, LLC; Roy D. Gross

(57) ABSTRACT

The present disclosure provides a vertical inverter and a semiconductor device including the vertical inverter, and the vertical inverter includes an insulation substrate, a first thin film transistor, and a second thin film transistor. By a layered arrangement of the first and second thin film transistors of the vertical inverter, more thin film transistors can be (Continued)

arranged within the limited space, so that the integration degree of the thin film transistors in the semiconductor device can be improved.

16 Claims, 8 Drawing Sheets

(58) Field of Classification Search
CPC ............ H01L 27/1214; H10K 59/1213; H10D 30/6729; H10D 30/6717; H10D 30/6728; H10D 30/6758; H10D 86/441; H10D 86/60; H10D 86/40
See application file for complete search history.

(56) References Cited

FOREIGN PATENT DOCUMENTS

| | | | |
|---|---|---|---|
| CN | 108493198 | A | 9/2018 |
| CN | 109300915 | A | 2/2019 |
| CN | 110707098 | A | 1/2020 |
| CN | 113113425 | A | 7/2021 |
| CN | 114420763 | A | 4/2022 |
| CN | 114743994 | A | 7/2022 |
| WO | 2015096441 | A1 | 7/2015 |

OTHER PUBLICATIONS

PCT Written Opinion of the International Search Authority for International Application No. PCT/CN2022/115984, mailed on Dec. 22, 2022, 9pp.
Chinese Office Action issued in corresponding Chinese Patent Application No. 202210952412.X dated Sep. 12, 2024, pp. 1-8, 16pp.

* cited by examiner

VERTICAL INVERTER AND SEMICONDUCTOR DEVICE

CROSS REFERENCE TO RELATED APPLICATIONS

This application is a National Phase of PCT Patent Application No. PCT/CN2022/115984 having International filing date of Aug. 30, 2022, which claims the benefit of priority of Chinese Application No. 202210952412.X filed on Aug. 9, 2022. The contents of the above applications are all incorporated by reference as if fully set forth herein in their entirety.

TECHNICAL FIELD

The present disclosure relates to a field of display technology, and more particularly, to a vertical inverter and a semiconductor device.

BACKGROUND

By integrating a pixel driving circuit, a gate driving circuit, a source driving circuit, a timing controller, and/or the like on a system on glass (SOG), the integration degree of a display panel can be greatly improved, the dependence on an integrated circuit chip can be reduced, and the cost can be reduced.

Technical Problem

For the implementation of SOG, the integration degree of the thin film transistors in the conventional display panel is required to be increased. That is, more thin film transistors are arranged within a limited space. Therefore, the performance of the thin film transistors is improved.

In sum, the conventional display panel has a problem of insufficient integration of the thin film transistors. Therefore, it is necessary to provide a vertical inverter and a semiconductor device to improve this defect.

Technical Solution

An embodiment of the present disclosure provides a vertical inverter and a semiconductor device, which can improve the integration degree of a thin film transistor in a conventional display panel, so that circuits such as a pixel driving circuit, a gate driving circuit, a source driving circuit, a timing controller and/or the like can be integrated on a glass substrate.

An embodiment of the present disclosure provides a vertical inverter comprising:
  an insulation substrate;
  a first thin film transistor disposed on the insulation substrate, wherein the first thin film transistor comprises a first active layer comprising a first channel region and N-type doped regions disposed on opposite sides of the first channel region; and
  a second thin film transistor disposed on a side of the first thin film transistor away from the insulation substrate, wherein the second thin film transistor comprises a second active layer, and the second active layer comprises a second channel region and P-type doped regions disposed on opposite sides of the second channel region, and wherein one of the P-type doped regions in the second active layer is electrically connected to a corresponding one of the N-type doped regions in the first active layer.

According to an embodiment of the present disclosure, the first thin film transistor comprises a bottom gate, and the bottom gate is disposed between the first active layer and the second active layer and disposed in alignment with the first channel region and the second channel region, respectively.

According to an embodiment of the present disclosure, a length of the second channel region in a direction from one of the P-doped regions on one of the opposite sides of the second channel region toward one of the P-doped regions on the other side of the opposite sides is smaller than a length of the bottom gate in the direction.

According to an embodiment of the present disclosure, the second thin film transistor comprises a top gate, and the top gate is disposed on a side of the second active layer away from the first active layer, and the top layer gate is disposed in alignment with the second channel region.

A length of the second channel region in a direction from one of the P-doped regions on one of the opposite sides of the second channel region toward one of the P-doped regions on the other side of the opposite sides is smaller than a length of the top gate in the direction.

According to an embodiment of the present disclosure, a length of the second channel region in a direction from one of the P-doped regions on one of the opposite sides of the second channel region toward one of the P-doped regions on the other side of the opposite sides is smaller than a length of the first channel region in the direction.

According to an embodiment of the present disclosure, a length of each of the P-type doped regions in a direction from one of the P-doped regions on one of the opposite sides of the second channel region toward one of the P-doped regions on the other side of the opposite sides is greater than a length of each of the N-type doped regions in the said direction.

According to an embodiment of the present disclosure, the second thin film transistor comprises a source and a drain, and one of the source and the drain is electrically connected to one of the P-type doped regions in the second active layer and one of the N-type doped regions in the first active layer.

According to an embodiment of the present disclosure, the vertical inverter comprises a first insulation layer and the first insulation layer is disposed between the first active layer and the second active layer, and
  wherein the first thin film transistor comprises at least one auxiliary electrode disposed between the first insulation layer and the second active layer, and the at least one auxiliary electrode passes through the first insulation layer and contacts a corresponding one of the N-type doped regions.

According to an embodiment of the present disclosure, the vertical inverter further comprises:
  a second insulation layer disposed between the at least one auxiliary electrode and the second active layer; and
  a third insulation layer disposed on a side of the second active layer away from the second insulation layer, wherein the source and the drain are disposed on a side of the third insulation layer away from the second insulation layer,
  wherein one of the source and the drain sequentially passes through the third insulation layer, a corresponding one of the P-type doped region, and the second insulation layer, and the source and the drain contact the at least one auxiliary electrode and one of the P-type doped regions, respectively.

According to an embodiment of the present disclosure, the vertical inverter further comprises:
- a second insulation layer disposed between the at least one auxiliary electrode and the second active layer; and
- a third insulation layer disposed on a side of the second active layer away from the second insulation layer, wherein the source and the drain are disposed on a side of the third insulation layer away from the second insulation layer,
- wherein a portion of one of the source and the drain passes through the third insulation layer and contacts one of the P-type doped regions, and another portion of one of the source and the drain sequentially passes through the third insulation layer and the second insulation layer and contacts the at least one auxiliary electrode.

According to an embodiment of the present disclosure, the vertical inverter further comprises:
- a second insulation layer disposed between the at least one auxiliary electrode and the second active layer;
- a third insulation layer disposed on a side of the second active layer away from the second insulation layer, wherein the source and the drain are disposed on a side of the third insulation layer away from the second insulation layer;
- wherein one of the source and the drain sequentially passes through the third insulation layer, one of the P-type doped region, the second insulation layer, and the first insulation layer, and contacts the one of the P-type doped regions and the N-type doped region, respectively.

According to an embodiment of the present disclosure, the first thin film transistor comprises a bottom gate, and the bottom gate is disposed in the same layer as the at least one auxiliary electrode and of the same material as the bottom gate.

According to an embodiment of the present disclosure, the second thin film transistor comprises a top gate and the top gate is disposed in the same layer as the source and the drain and of the same material as the source and the drain.

According to an embodiment of the present disclosure, the bottom gate is of a different material from the top gate.

According to an embodiment of the present disclosure, the top gate contacts the bottom gate through an insulation layer between the top gate and the bottom gate.

According to the vertical inverter according to the above embodiment of the present disclosure, an embodiment of the present disclosure further provides a semiconductor device including a vertical inverter including:
- an insulation substrate;
- a first thin film transistor disposed on the insulation substrate, wherein the first thin film transistor comprises a first active layer comprising a first channel region and N-type doped regions disposed on opposite sides of the first channel region; and
- a second thin film transistor disposed on a side of the first thin film transistor away from the insulation substrate, wherein the second thin film transistor comprises a second active layer, and the second active layer comprises a second channel region and P-type doped regions disposed on opposite sides of the second channel region, and wherein one of the P-type doped regions in the second active layer is electrically connected to a corresponding one of the N-type doped regions in the first active layer.

According to an embodiment of the present disclosure, the first thin film transistor comprises a bottom gate, and the bottom gate is disposed between the first active layer and the second active layer and disposed in alignment with the first channel region and the second channel region, respectively.

According to an embodiment of the present disclosure, a length of the second channel region in a direction from one of the P-doped regions on one of the opposite sides of the second channel region toward one of the P-doped regions on the other side of the opposite sides is smaller than a length of the bottom gate in the direction.

According to an embodiment of the present disclosure, the second thin film transistor comprises a top gate, and the top gate is disposed on a side of the second active layer away from the first active layer, and the top layer gate is disposed in alignment with the second channel region.

Beneficial Effects

One of advantageous effects of embodiments of the present disclosure: an embodiment of the present disclosure provides a vertical inverter and a semiconductor device including the vertical inverter, and the vertical inverter includes an insulation substrate, a first thin film transistor and a second thin film transistor, wherein the first thin film transistor includes a first active layer including a first channel region and N-type doped regions disposed on opposite sides of the first channel region, wherein the second thin film transistor is disposed on one side of the first thin film transistor away from the insulation substrate, and the second thin film transistor includes a second active layer including a second channel region and P-type doped regions disposed on opposite sides of the second channel region, wherein one of the P-type doped regions in the second active layer is electrically connected to a corresponding one of the N-type doped regions in the first active layer, and wherein by a layered arrangement of the first and second thin film transistors of the vertical inverter, more thin film transistors can be arranged within the limited space, so that the integration degree of the thin film transistors in the semiconductor device can be improved.

BRIEF DESCRIPTION OF THE DRAWINGS

In order to more clearly illustrate embodiments or technical solutions in the related art, the accompanying drawings required for the description of the embodiments or the related art will be briefly described. It will be apparent that the accompanying drawings in the description below are merely some of the embodiments in the present disclosure, and additional drawings may be obtained by those of ordinary skill in the art without involving any inventive effort.

DESCRIPTION OF SPECIFIC EMBODIMENTS OF THE INVENTION

Figure 1:
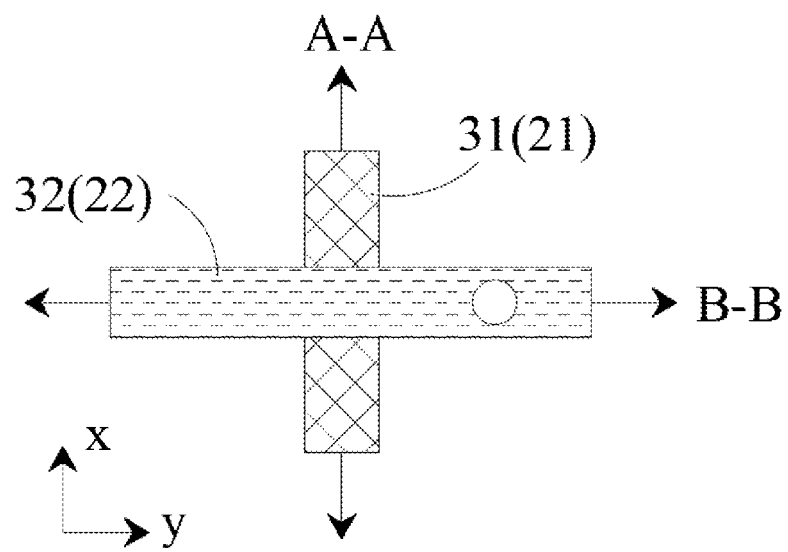
FIG. 1 is an equivalent circuit diagram of a vertical inverter according to an embodiment of the present disclosure.

The following description of the embodiments is made with reference to the accompanying drawings to illustrate specific embodiments in which the present disclosure may be practiced. The use of directional terms, for example, upper, lower, front, rear, left, right, inner, outer, side, and the like, in the present disclosure are only directions with reference to the accompanying drawings. Thus, the use of the directional terms is for illustrating and understanding the present disclosure, and not to limit the present disclosure. In the figures, structurally similar elements are denoted by the same reference numerals.

The present disclosure is further described below with reference to the accompanying drawings and specific embodiments.

An embodiment of the present disclosure provides a vertical inverter and a semiconductor device, which can improve the integration degree of thin film transistors in a conventional semiconductor device, so that circuits such as a pixel driving circuit, a gate driving circuit, a source driving circuit, and a timing controller can be integrated on a glass substrate.

Figure 2:
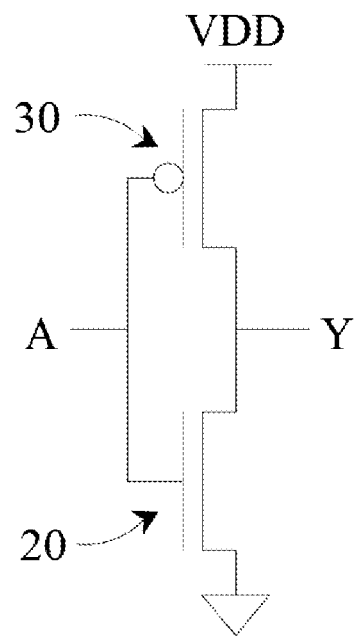
FIG. 2 is a schematic plan view of a vertical inverter according to an embodiment of the present disclosure.
Figure 3:
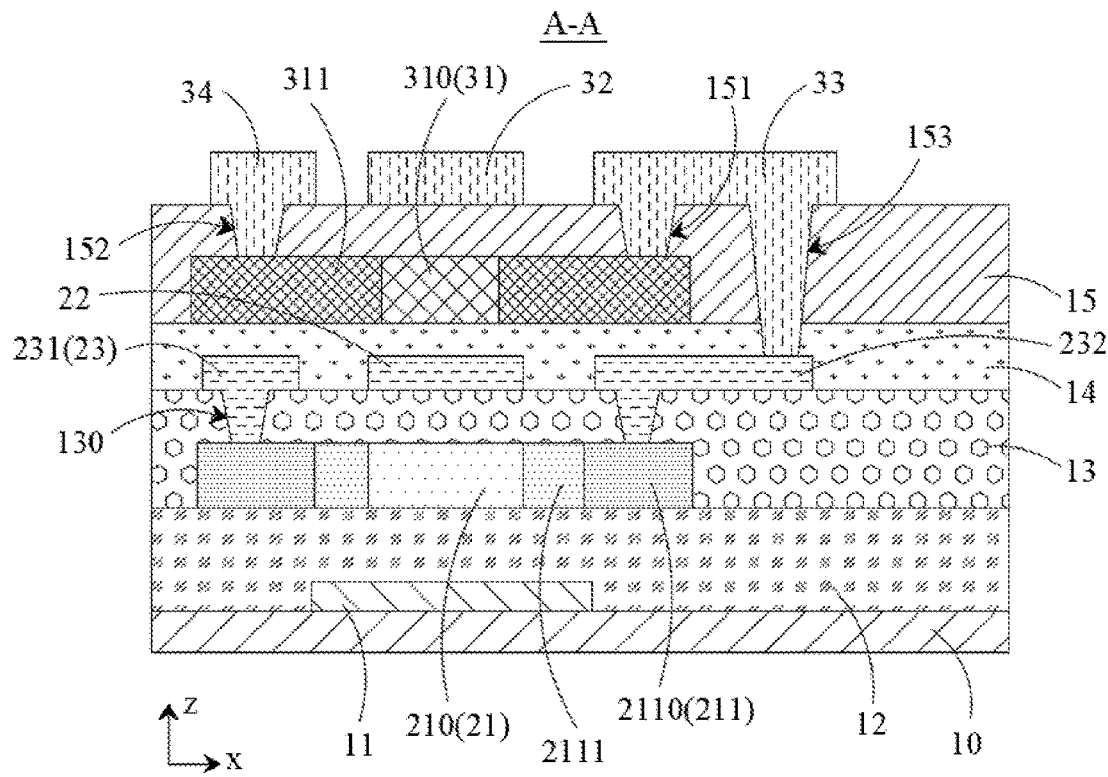
FIG. 3 is a schematic cross-sectional view of a first vertical inverter in the direction A-A according to an embodiment of the present disclosure.

As shown in FIGS. 1 to 3, FIG. 1 is an equivalent circuit diagram of a vertical inverter according to an embodiment of the present disclosure, FIG. 2 is a schematic plan view of a vertical inverter according to an embodiment of the present disclosure, and FIG. 3 is a schematic cross-sectional view of a first vertical inverter in the A-A direction according to an embodiment of the present disclosure. The first vertical inverter includes an insulation substrate 10, a first thin film transistor 20, and a second thin film transistor 30.

The first thin film transistor 20 is an N-type thin film transistor, and the second thin film transistor 30 is a P-type thin film transistor. Gates of the first thin film transistor 20 and the second thin film transistor 30 are connected to a same control terminal A. A drain of the second thin film transistor 30 receives a power supply voltage VDD. A source of the second thin film transistor 30 and a drain of the first thin film transistor 20 are connected to a same output terminal Y. A source of the first thin film transistor 20 is grounded.

When a control signal input from the control terminal is high, the first thin film transistor 20 is turned on, the second thin film transistor 30 is turned off, the output terminal Y is grounded by the first thin film transistor 20, and an output signal is low. When the control signal input from the control terminal is low, the first thin film transistor 20 is turned off, the second thin film transistor 30 is turned on, the power supply voltage signal VDD input through the drain of the second thin film transistor 30 is output to the output terminal Y through the second thin film transistor 30, and the output signal is high.

In an embodiment of the present disclosure, the first thin film transistor 20 is disposed on the insulation substrate 10, and the second thin film transistor 30 is disposed on a side of the first thin film transistor 20 away from the insulation substrate 10.

It should be noted that the "be disposed on the insulation substrate 10" may refer to direct contact with the insulation substrate 10 or indirect contact with the insulation substrate 10.

In an embodiment of the present disclosure, the insulation substrate 10 is a glass substrate. In other embodiments, a material of the insulation substrate 10 may also be, but is not limited to, a flexible transparent organic material such as polyimide or the like.

In an embodiment of the present disclosure, the vertical inverter further includes a light shielding layer 11 disposed on the insulation substrate 10, and a buffer layer 12 disposed on the insulation substrate 10 and covering the light shielding layer 11. The first thin film transistor 20 is disposed on a side of the buffer layer 12 away from the insulation substrate 10.

The first thin film transistor 20 includes a first active layer 21 disposed on the side of the buffer layer 12 away from the insulation substrate 10. The first active layer 21 includes a first channel region 210 and N-type doped regions 211 disposed on opposite sides of the first channel region 210. The N-type doped regions 211 abut the first channel region 210.

The N-type doped regions 211 include an N-type heavily doped region 2110 and an N-type lightly doped region 2111. The N-type lightly doped region 2111 abuts the first channel region 210. The N-type heavily doped region 2110 abuts a side of the N-type lightly doped region 2111 away from the first channel region 210. The light blocking layer 11 is disposed in alignment with the first channel region 210 and the N-type lightly doped regions 2111 on opposite sides of the first channel region 210.

The second thin film transistor 30 includes a second active layer 31 disposed on a side of the first active layer 21 away from the insulation substrate 10. The second active layer 31 includes a second channel region 310 and P-type doped regions 311 disposed on opposite sides of the second channel region 310. The P-type doped regions 311 abut the second channel region 310. One of the P-type doped regions 311 in the second active layer 31 is electrically connected to a corresponding one of the N-type doped regions 211 in the first active layer 21.

In one embodiment, materials of the first active layer 21 and the second active layer 31 are polysilicon. The N-type doped regions 211 may be doped with impurity elements such as phosphorus, arsenic, or the like. The P-type doped regions 311 may be doped with impurity elements such as boron, gallium, or the like.

In one embodiment, the materials of the first active layer 21 and the second active layer 31 are not limited to the polysilicon in the above embodiment, but may also include amorphous silicon (a-Si).

In one embodiment, the vertical inverter is a complementary metal oxide semiconductor (CMOS) inverter. The materials of the first active layer 21 and the second active layer 31 may be a metal oxide semiconductor material, which may include, but is not limited to, indium gallium zinc oxide (IGZO).

Further, the first thin film transistor 20 includes a bottom gate 22, and the bottom gate 22 is disposed between the first active layer 21 and the second active layer 31 and is disposed in alignment with the first channel region 210 and the second channel region 310, respectively.

As shown in FIG. 3, the vertical inverter further includes a first insulation layer 13, which may also be referred to as a first gate insulation layer, and a second insulation layer 14, which may be referred to as a second gate insulation layer.

The first insulation layer 13 may be disposed between the first active layer 21 and the second active layer 31.

In one embodiment, as shown in FIG. 3, the first insulation layer 13 is disposed on the side of the buffer layer 12 away from the insulation substrate 10 and covers the first active layer 21. The bottom gate 22 is disposed on the side of the first active layer 21 away from the insulation substrate 10.

The second insulation layer 14 is disposed on a side of the first insulation layer 13 away from the insulation substrate 10 and covers the bottom gate 22. The second active layer 31 is disposed on a side of the second insulation layer 14 away from the first insulation layer 13.

The bottom gate 22 is disposed in alignment with the first channel region 210 of the first active layer 21. The bottom gate 22 is also disposed in alignment with the second channel region 310 of the second active layer 31. The first thin film transistor 20 and the second thin film transistor 30 may share the bottom gate 22.

Further, the second thin film transistor 30 includes a top gate 32 disposed on a side of the second active layer 31 away from the bottom gate 22. The top gate 32 is disposed in alignment with the second channel region 310 and electrically connected to the bottom gate 22.

As shown in FIG. 3, the vertical inverter further includes a third insulation layer 15, which may be referred to as an interlayer dielectric layer. The third insulation layer 15 is disposed on a side of the second active layer 31 away from the first insulation layer 13 and covers the second active layer 31. The top gate 32 is disposed on a side of the third insulation layer 15 away from the second insulation layer 14.

Further, the top gate 32 contacts the bottom gate 22 penetrating through the insulation layers between the top gate 32 and the bottom gate 22.

Figure 4:
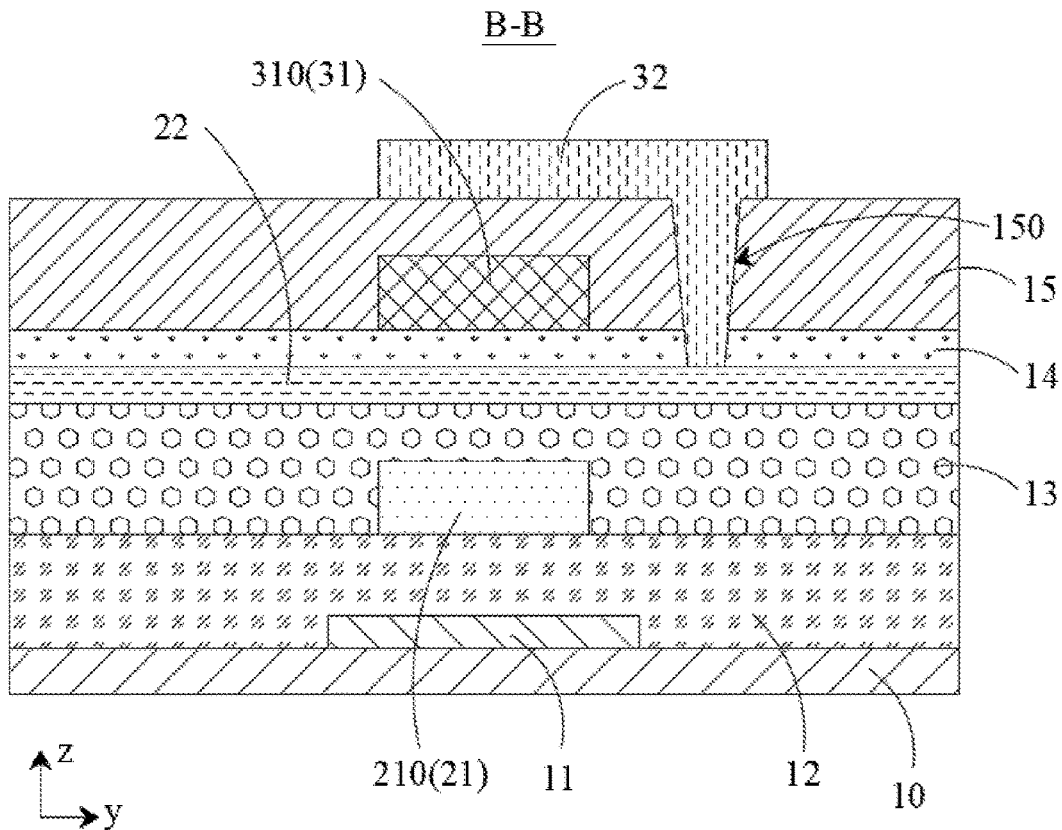
FIG. 4 is a schematic cross-sectional view of a first vertical inverter in the direction B-B according to an embodiment of the present disclosure.

As shown in FIG. 4, FIG. 4 is a schematic cross-sectional view of a first vertical inverter in the direction B-B according to an embodiment of the present disclosure. A gate interconnect hole 150 passing through the third insulation layer 15 and the second insulation layer 14 and exposing the bottom gate 22 is disposed on the third insulation layer 15. The gate interconnect hole 150 passes through the third insulation layer 15 and the second insulation layer 14 and exposes a side surface of the bottom gate 22 away from the insulation substrate 10. The top gate 32 extends up to the bottom of the gate interconnect hole and contacts the side surface of the bottom gate 22 away from the insulation substrate 10.

The bottom gate 22 and the top gate 32 may be common to the second thin film transistor 30, so that the second thin film transistor 30 may be regarded as a double gate structure.

Note that when the second thin film transistor 30 is a single-gate structure, since the first thin film transistor 20 is an N-type thin film transistor, carriers in the first active layer 21 are electrons, the second thin film transistor 30 is a P-type thin film transistor, carriers in the second active layer 31 are holes. The mobility of the holes is generally lower than the mobility of the electrons. Therefore, an on-state current of the second thin film transistor 30 is lower than an on-state current of the first thin film transistor 20 under a same condition. By providing the second thin film transistor 30 as the double gate structure, the on-state current of the second thin film transistor 30 can be increased to more closely match the first thin film transistor 20 in the same process, thereby improving the electrical performance of the vertical inverter.

Further, a length of the second channel region 310 in a direction from one of the P-doped regions on one of the opposite sides toward one of the P-doped regions on the other side of the opposite sides is smaller than the length of the first channel region 210 in the said direction.

As shown in FIG. 3, the direction from the P-doped regions on one side toward the P-doped regions on the opposite side is defined to be a first direction x. A direction parallel to a direction B-B is defined to be a second direction y. A thickness direction of the vertical inverter is defined to be a third direction z. The length of the first channel region 210 in the first direction x is larger than the length of the second channel region 310 in the first direction x.

Further, a length of each of the P-type doped regions in the direction from one of the P-doped regions on one of the opposite sides toward one of the P-doped regions on the other side of the opposite sides is larger than a length of each of the N-type doped regions in the said direction.

As shown in FIG. 3, the length of each of the P-type doped regions 311 in the second active layer 31 in the first direction x is smaller than the length of each of the N-type doped regions 211 in the first active layer 21 in the first direction x.

Further, the length of each of the P-doped regions in the direction from one of the P-doped regions on one of the opposite sides toward one of the P-doped regions on the other side of the opposite sides is smaller than the length of the bottom gate 22 in the said direction.

In one embodiment, as shown in FIG. 3, the length of the second channel region 310 in the first direction x is less than the length of the bottom gate 22 in the first direction x. An orthographic projection of the bottom gate 22 on the insulation substrate 10 completely covers an orthographic projection of the second channel region 310 on the insulation substrate 10.

In one embodiment, the length of the first channel region 210 in the first direction x may be equal to the length of the bottom gate 22 in the first direction x.

It should be noted that when the first active layer 21 is doped to form the N-type lightly doped region 2111, the first channel region 210 may be shielded by the bottom gate 22, so that the length of the bottom gate 22 is equal to the length of the first channel region 210, and it is ensured that the first channel region 210 is within a range controllable by the bottom gate 22.

When the second active layer 31 is doped to form the P-type doped regions 311, no metal film layer is used to shield and above the second channel region 310. Due to alignment accuracy defects, the second channel region 310 may deviate from the bottom gate 22, so that it is not controlled by the bottom gate 22. The length of the second channel region 310 is reduced. Therefore, even if the second channel region 310 deviates from the bottom gate 22, it is possible to ensure that the second channel region 310 does not go beyond the control range of the bottom gate 22, thereby improving the production yield and ensuring the electrical performance of the vertical inverter.

Further, the length of the second channel region 310 in the direction from one of the P-doped regions on one of the opposite sides toward one of the P-doped regions on the other side of the opposite sides is smaller than the length of the top gate 32 in the said direction.

In one embodiment, as shown in FIG. 3, the length of the second channel region 310 in the first direction x is smaller than the length of the top gate 32 in the first direction x. An orthographic projection of the top gate 32 on the insulation substrate 10 completely covers the orthographic projection of the second channel region 310 on the insulation substrate 10. Even if the second channel region 310 deviates from the top gate 32, it is ensured that the second channel region 310 is within a range controllable by the top gate 32, thereby improving the production yield and ensuring the electrical performance of the vertical inverter.

In one embodiment, the length of the top gate 32 in the first direction x is same as the length of the bottom gate 22 in the first direction x and the length of the first channel region 210 in the first direction x.

Further, the second thin film transistor 30 includes a source 33 and a drain 34. The source 33 is electrically connected to one of the P-type doped regions 311 in the second active layer 31 and one of the N-type doped regions 211 in the first active layer 21, respectively.

Further, the source 33 passes at least through the third insulation layer 15 and contacts the P-type doped regions.

In one embodiment, the first thin film transistor 20 includes at least one auxiliary electrode 23, and the at least one auxiliary electrode 23 is disposed on the side of the first insulation layer 13 away from the insulation substrate 10 and passes through the first insulation layer 13 and contacts a corresponding one of the N-type doped regions 211.

As shown in FIG. 3, the auxiliary electrode 23 includes a first auxiliary electrode 231 and a second auxiliary electrode 232. The first auxiliary electrode 231 corresponds to the source of the first thin film transistor 20 and the second auxiliary electrode 232 corresponds to the drain of the first thin film transistor 20. A plurality of auxiliary interconnect holes 130 are disposed on the first insulation layer 13 and the auxiliary interconnect holes 130 penetrate through the first insulation layer 13 and expose the N-type heavily doped regions 2110. The first auxiliary electrode 231 contacts a corresponding one of the N-type heavily doped regions 2110 in the first active layer 21 through one of the auxiliary interconnect holes 130. The second auxiliary electrode 232 contacts another one of the N-type heavily doped regions 2110 in the first active layer 21 through another one of the auxiliary interconnect holes 130.

A first source interconnect hole 151 and a drain interconnect hole 152 is disposed on the third insulation layer 15, and the first source interconnect hole 151 and the drain interconnect hole 152 pass through the third insulation layer 15 and expose one of the P-type doped regions 311. A second source interconnect hole 153 is further disposed on the third insulation layer 15, and the second source interconnect hole 153 sequentially passes through the third insulation layer 15 and the second insulation layer 14, and exposes a side surface of the second auxiliary electrode 232 away from the insulation substrate 10.

The drain 34 contacts a corresponding one of the P-type doped regions through the drain interconnect hole 152. A part of the source 33 extends into the first source interconnect hole 151, passes through the third insulation layer 15, and contacts another one of the P-type doped regions. Another part of the source 33 extends into the second source interconnect hole 153, sequentially passes through the third insulation layer 15 and the second insulation layer 14, and contacts the side surface of the second auxiliary electrode 232 away from the insulation substrate 10. Therefore, the source 33 of the second thin film transistor 30 is connected to the drain of the first thin film transistor 20.

Figure 5:
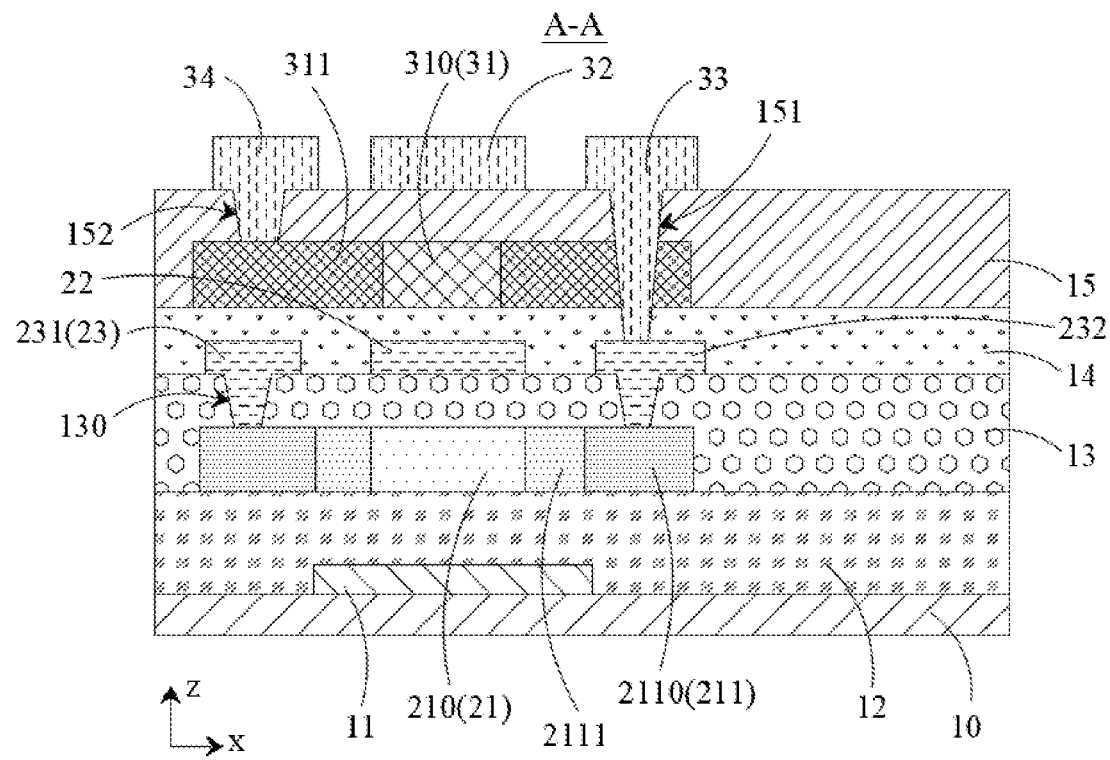
FIG. 5 is a schematic cross-sectional view of a second vertical inverter in the direction A-A according to an embodiment of the present disclosure.

As shown in FIG. 5, FIG. 5 is a schematic cross-sectional view of a second vertical inverter in the A-A direction according to an embodiment of the present disclosure. The structure of the second vertical inverter is substantially the same as that of the first vertical inverter shown in FIGS. 3 and 4, except that the source 33 sequentially passes through the third insulation layer 15, one of the P-type doped regions 311, and the second insulation layer 14, and contacts the second auxiliary electrode 232.

As shown in FIG. 5, a drain interconnect hole 152 is disposed on the third insulation layer 15, and the drain interconnect hole 152 passes through the third insulation layer 15 and exposes one of the P-type doped regions 311 in the second active layer 31. The drain 34 contacts a corresponding one of the P-type doped regions through the drain interconnect hole 152.

A first source interconnect hole 151 is further disposed on the third insulation layer 15, and the first source interconnect hole 151 sequentially passes through the third insulation layer 15, one of the P-type doped regions 311 and the second insulation layer 14. The sidewall of the first source interconnect hole 151 exposes another of the P-type doped regions 311 in the second active layer 31, and also exposes the side surface of the second auxiliary electrode 232 away from the insulation substrate 10. The source 33 extends into the first source interconnect hole 151, and sequentially passes through the third insulation layer 15, one of the P-type doped regions 311, and the second insulation layer 14, and contacts the one of the P-type doped regions 311 and the second auxiliary electrode 232, respectively, so that the source 33 of the second thin film transistor 30 is connected to the drain of the first thin film transistor 20.

In comparison with the first vertical inverter shown in FIG. 3, the second inverter shown in FIG. 5 does not need to additionally have the second source interconnect hole 153, so that the configuration of the vertical inverter can be simplified.

Figure 6:
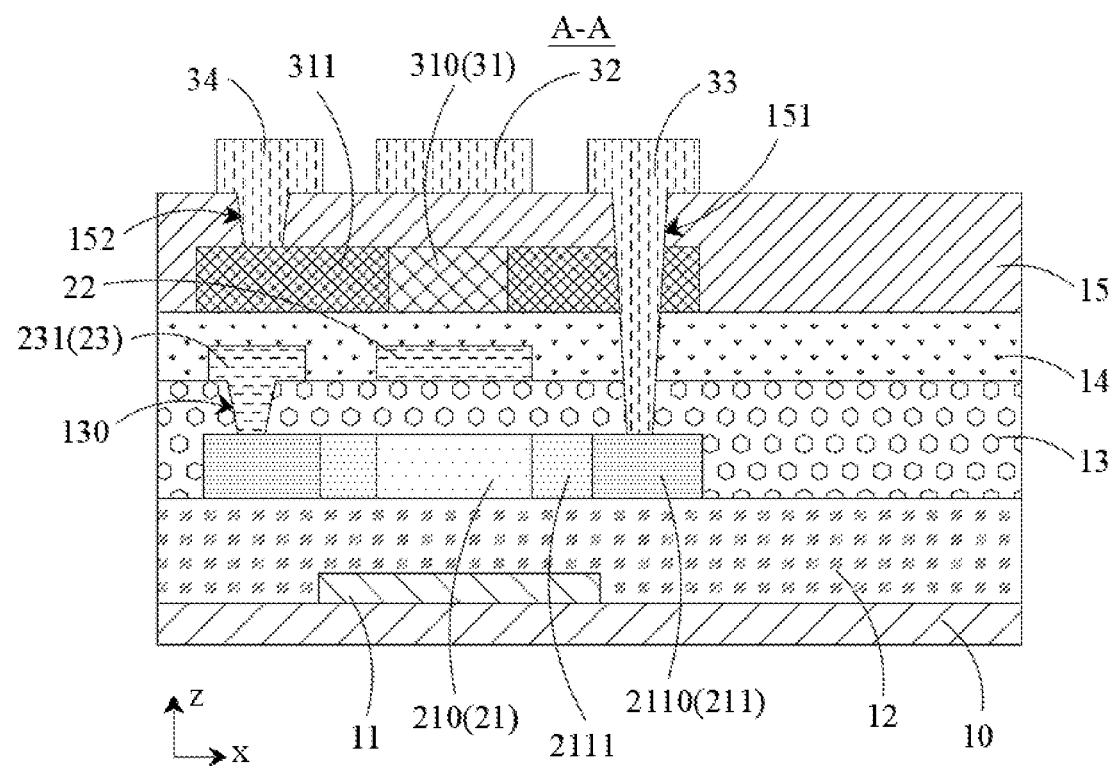
FIG. 6 is a schematic cross-sectional view of a third vertical inverter in the direction A-A according to an embodiment of the present disclosure.

As shown in FIG. 6, FIG. 6 is a schematic cross-sectional view of a third vertical inverter in the direction A-A according to an embodiment of the present disclosure. The structure of the third vertical inverter is substantially the same as that of the second vertical inverter shown in FIG. 5, except that the source 33 sequentially passes through the third insulation layer 15, one of the P-type doped regions 311, the second insulation layer 14, and the first insulation layer 13, and contacts the one of the P-type doped regions 311 and one of the N-type doped regions 211, respectively.

As shown in FIG. 6, a drain interconnect hole 152 is disposed on the third insulation layer 15, and the drain interconnect hole 152 passes through the third insulation layer 15 and exposes one of the P-type doped regions 311 in the second active layer 31. The drain 34 contacts a corresponding one of the P-type doped regions through the drain interconnect hole 152.

The first thin film transistor 20 includes only the first auxiliary electrode 231, which passes through the first insulation layer 13 and contacts a corresponding one of the N-type heavily doped regions 2110 in the first active layer 21.

A first source interconnect hole 151 is disposed on the third insulation layer 15, and the first source interconnect hole 151 sequentially passes through the third insulation layer 15, another of the P-type doped regions 311, the second insulation layer 14, and the first insulation layer 13. A sidewall of the first source interconnect hole 151 exposes another of the P-type doped regions 311 in the second active layer 31, and also expose a side surface of one of the N-type heavily doped regions 2110 away from the insulation substrate 10. The source 33 extends into the first source interconnect hole 151, and sequentially passes through the third insulation layer 15, another of the P-type doped regions 311, the second insulation layer 14, and the first insulation layer 13, and contacts another of the P-type doped regions 311 and the corresponding one of the N-type heavily doped regions 2110 in the first active layer 21, respectively, so that the source 33 of the second thin film transistor 30 is connected to the drain of the first thin film transistor 20.

Further, the bottom gate 22 is disposed in the same layer as the auxiliary electrode 23 and of the same material as the auxiliary electrode 23.

As shown in FIG. 3, FIG. 5, or FIG. 6, the bottom gate 22 and the auxiliary electrode 23 are each disposed on the side surface of the first insulation layer 13 away from the insulation substrate 10.

The material of the bottom gate 22 may be a material commonly used in conventional gate metal layers. For example, both the bottom gate 22 and the auxiliary electrode 23 may be a single-layer metal thin film structure formed by molybdenum.

In practical application, the bottom gate 22 and the auxiliary electrode 23 are not limited to a single-layer metal structure formed of molybdenum in the above-described embodiment, but may be a single-layer metal thin film structure formed of aluminum (Al). Alternatively, the bottom gate 22 and the auxiliary electrode 23 may be a composite metal film layer of two or more layers formed by laminating Mo and Al materials, for example, a three-layer composite metal structure of Mo/Al/Mo; Alternatively, the bottom gate 22 and the auxiliary electrode 23 may be a composite metal film layers of two or more layers formed by laminating Mo and W materials, for example, a double-layer composite metal structure of W/Mo.

In the actual manufacturing process, the bottom layer gate 22 may be manufactured by using the same metal film forming process as the auxiliary electrode 23.

By sharing the bottom gate 22 in the double gate structure of the second thin film transistor 30 with the first thin film transistor 20, and arranging the source and the drain of the first thin film transistor in the same layer as the bottom gate 22, the source and the drain of the first thin film transistor 20 (i.e., the auxiliary electrode 23) may be formed at the same time using the metal film forming process of the bottom gate 22, whereby the film layer structure of the vertical inverter can be simplified without increasing the processes.

Further, the top gate 32 is disposed in the same layer as the source 33 and the drain 34, and is of the same material as the source 33 and the drain 34.

As shown in FIG. 1, each of the source 33 and the drain 34 of the second thin film transistor 30 and the top gate 32 are disposed on a side surface of the third insulation layer 15 away from the insulation substrate 10.

The materials of the top gate 32, the source 33, and the drain 34 may include, but is not limited to, any one of metallic materials such as aluminum (Al), titanium (Ti), copper (Cu), (Mo), or the like, or may be a combination of any two or more of the foregoing metallic materials. Each of the top gate 32, the source 33 and the drain 34 may be a single-layer metal structure or may be a composite metal film structure of two or more layers.

In one embodiment, the material of the top gate 32 is different from the material of the bottom gate 22, and the material of the bottom gate 22 is a material commonly used in conventional gate metal layers, and the material of the top gate 32 may be a material commonly used in conventional source/drain metal layers.

For example, the source 33, the drain 34, and the top gate electrode 32 may be a three-layer composite metal structure of Ti/Al/Ti formed by laminating aluminum and titanium. In other embodiments, the source 33, the drain 34 and the top gate 32 may also be a single-layer metal structure formed of copper (Cu), or a three-layer composite metal structure formed of molybdenum and aluminum.

In an actual manufacturing process, the top gate 32 may be formed using the same metal film forming process as the source 33 and the drain 34.

By disposing the top gate 32 and the source 33 and the drain 34 of the second thin film transistor in the same layer, the top gate 32 can be formed in the same metal film forming process as the source 33 and the drain 34 of the second thin film transistor 30, thereby simplifying the film layer structure of the vertical inverter without increasing the processes. The top gate 32 and the bottom gate 22 are connected by a via, which may be formed simultaneously with the via required for the source 33 to contact the second auxiliary electrode 232 or the N-type heavily doped region 2110, so that the processes may not be increased. In accordance with the vertical inverter according to the above embodiments of the present disclosure, an embodiment of the present disclosure further provides a method of fabricating a vertical inverter for fabricating and forming the vertical inverter according to the above embodiments.

As shown in FIGS. 7a to 7l, FIG. 7a to FIG. 7l are schematic flow diagrams of a method for manufacturing a vertical inverter according to an embodiment of the present disclosure, the method including:

Step S10: providing the light shielding layer 11 on the insulation substrate 10.

Figure 7A:
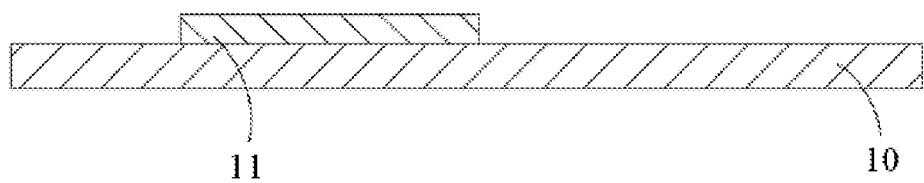
FIGS. 7a to 7l are schematic flow diagrams of a method for manufacturing a vertical inverter according to an embodiment of the present disclosure.

As shown in FIG. 7a, the step S10 may include forming one layer of metal material on the insulation substrate 10, and etching the metal material to form a plurality of patterned light shielding layers 11.

Step S20: forming the buffer layer 12 on the insulation substrate 10, and forming the first active layer 21 on the buffer layer.

Figure 7B:
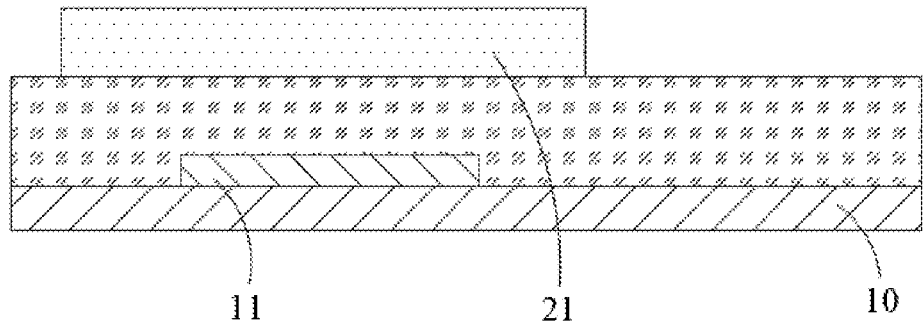

As shown in FIG. 7b, the step S20 may specifically include depositing one layer of semiconductor material on the buffer layer 12, and sequentially performing crystallization processing and etching on the semiconductor material to form the plurality of first active layers 21.

The semiconductor material may be amorphous silicon (a-Si), and a plurality of patterned first active layers 21 are formed by crystallizing the amorphous silicon to form a polysilicon layer, and then etching the polysilicon layer.

Step S30: doping the first active layer 21 to form the N-type heavily doped regions 2110 at opposite ends.

Figure 7C:
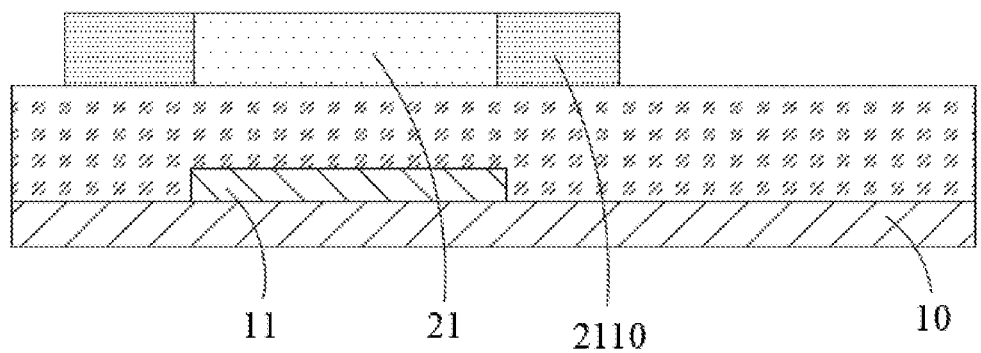

As shown in FIG. 7c, impurity elements such as phosphorus, arsenic, or the like may be doped into the opposite ends of the first active layer 21 so that the N-type heavily doped regions 2110 are formed at the opposite ends of the first active layer 21, and a portion between the N-type heavily doped regions 2110 at the opposite ends is an intrinsic semiconductor.

Step S40: forming the first insulation layer 13 on the first active layer 21, and etching the first insulation layer 13 to form the plurality of auxiliary interconnect holes 130.

Figure 7D:
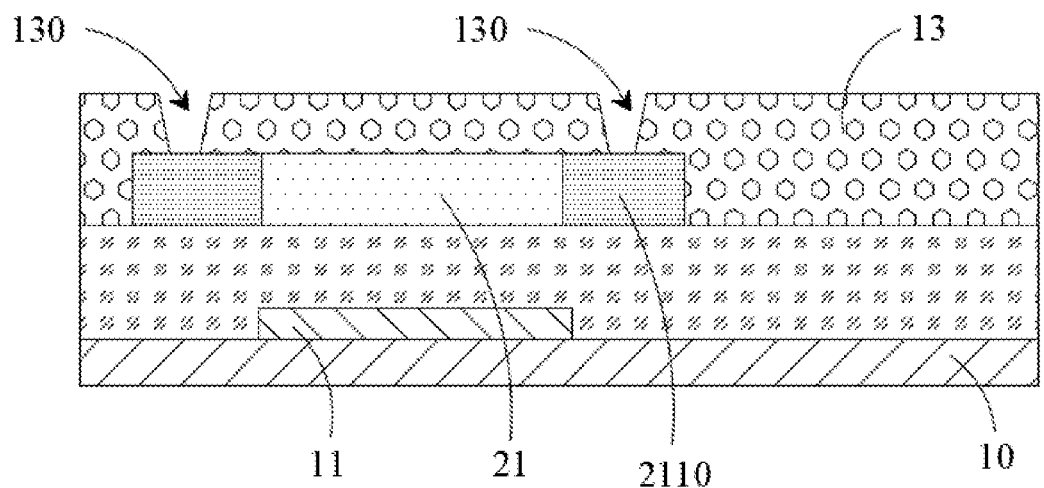

As shown in FIG. 7d, the auxiliary interconnect hole 130 passes through the first insulation layer 13 and exposes the N-type heavily doped regions 2110 at both ends of the first active layer 21.

Step S50: forming the bottom gate 22 and the auxiliary electrode 23 on the first insulation layer 13.

Figure 7E:
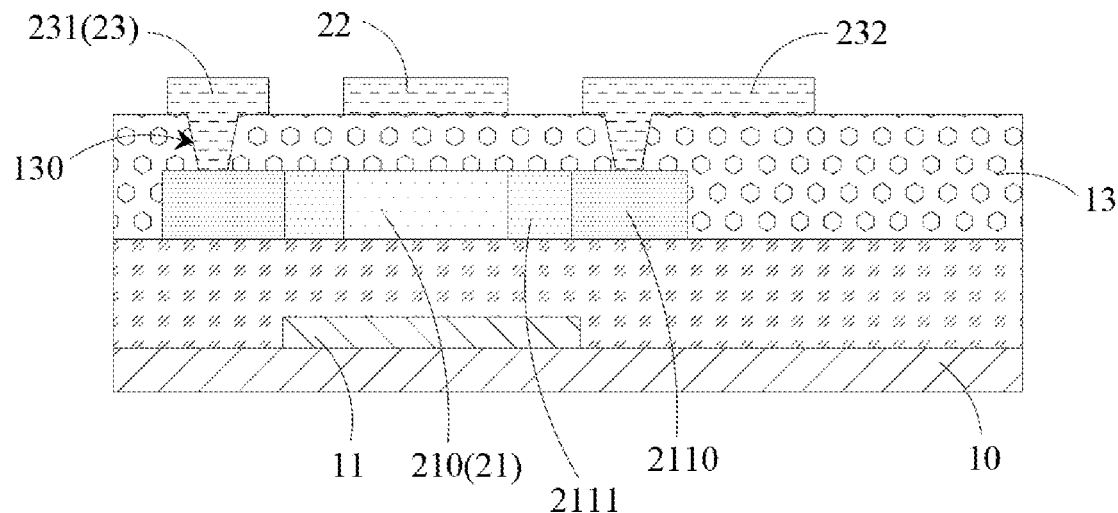

As shown in FIG. 7e, the step S50 may specifically include depositing a metal material on the first insulation layer 13, etching the metal material, and forming the bottom gate 22 and the auxiliary electrode 23.

The bottom gate 22 is disposed in alignment with the active layer 21, and the auxiliary electrode 23 contacts the N-type heavily doped regions 2110 through the auxiliary interconnect hole 130.

The auxiliary electrode 23 includes a first auxiliary electrode 231 corresponding to the source of the first thin film transistor and a second auxiliary electrode 232 corresponding to the drain of the first thin film transistor.

Step S50 may further include performing a lightly doping process on the first active layer 21 so that the N-type lightly doped regions 2111 and the first channel region 210 between the two N-type light doped regions 2111 are formed in a region of the first active layer 21 that is not shielded by the bottom gate 22 and the auxiliary electrode 23. The dopant concentration of the N-type lightly doped region 2111 is lower than the dopant concentration of the N-type heavily doped region 2110, and the N-type lightly doped region 2111 and the N-type heavily doped region 2110 may be doped with the same element.

Step S60: forming a second insulation layer 14 on the first insulation layer 13, and forming a second active layer 31 on the second insulation layer 14.

Figure 7F:
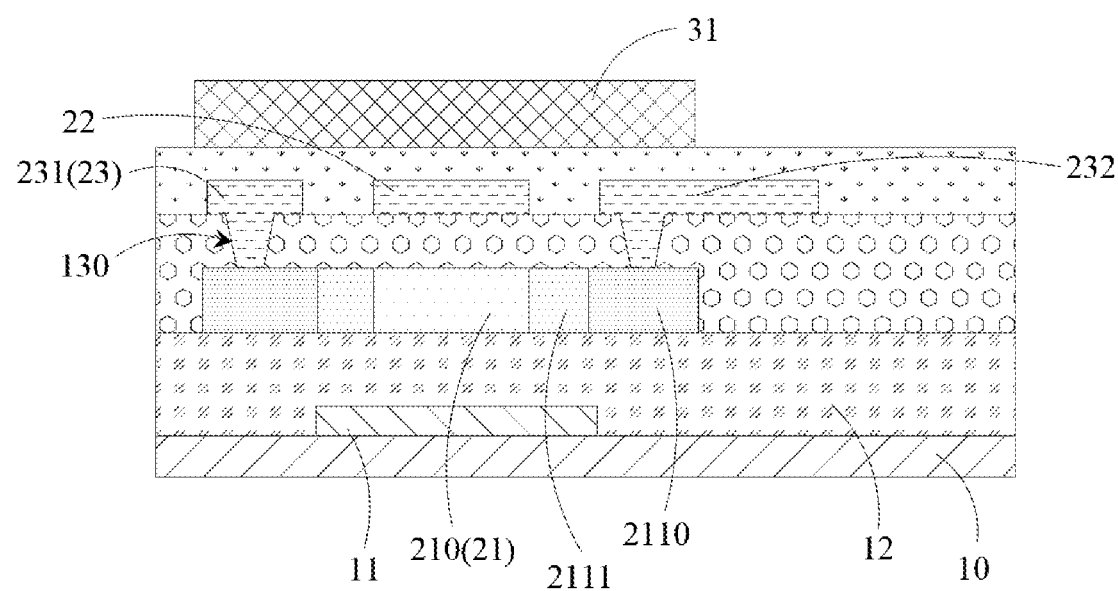

As shown in FIG. 7f, Step S60 may include depositing one layer of semiconductor material on the second insulation layer 14, and sequentially performing crystallization processing and etching on the semiconductor material to form the plurality of second active layers 31.

The semiconductor material may be amorphous silicon (a-Si), and a plurality of patterned second active layers 31 are formed by crystallizing the amorphous silicon to form polysilicon, and then etching the polysilicon layer.

Step S70: doping the second active layer 31 to form the P-type doped regions 311 and the second channel region 310.

Figure 7G:
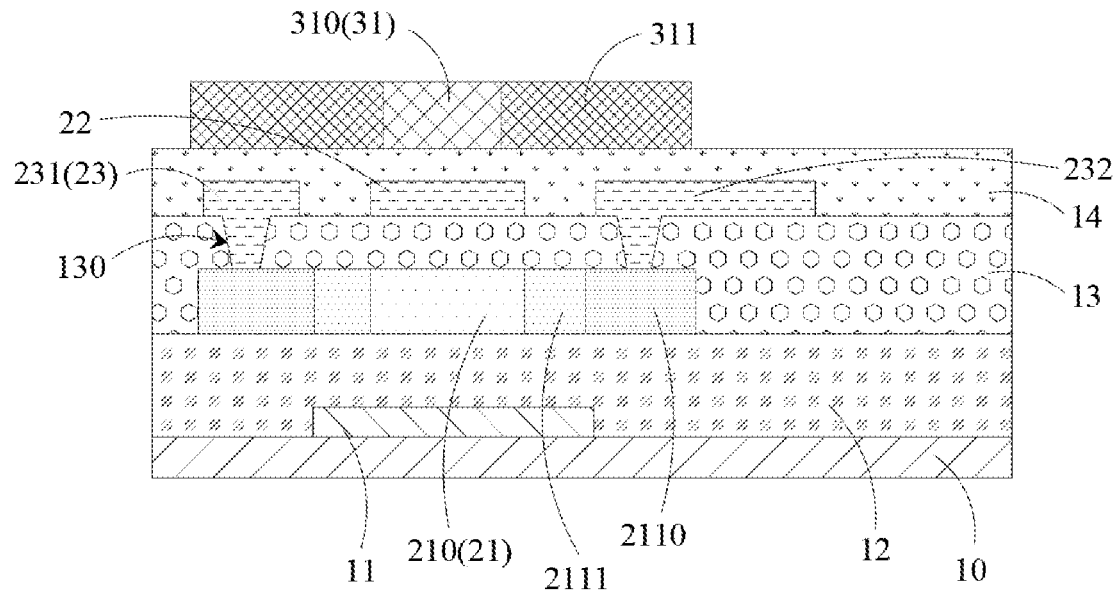

As shown in FIG. 7g, the P-type doped regions 311 are located on opposite sides of the second channel region 310 and abut the second channel region 310. Impurity elements such as boron or gallium may be doped into P-type doped regions 311.

Step S80: forming the third insulation layer 15 on the second active layer 31, and etching the third insulation layer 15 to form the first source interconnect hole 151 and the drain interconnect hole 152.

Figure 7H:
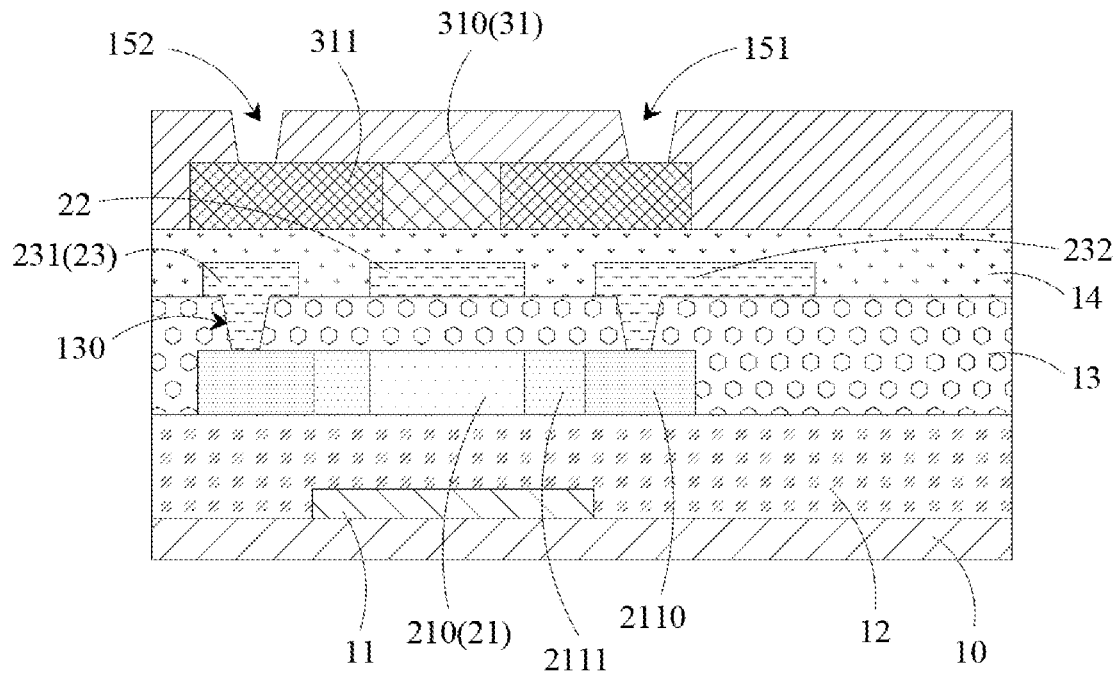

As shown in FIG. 7h, both the first source interconnect holes 151 and the drain interconnect holes 152 pass through the third insulation layer 15 and expose the P-type doped regions 311 in the second active layer 31, respectively.

Step S90: etching the third insulation layer 15 and the second insulation layer 14 to form the second source interconnect hole 153 and the gate interconnect hole 150.

Figure 7I:
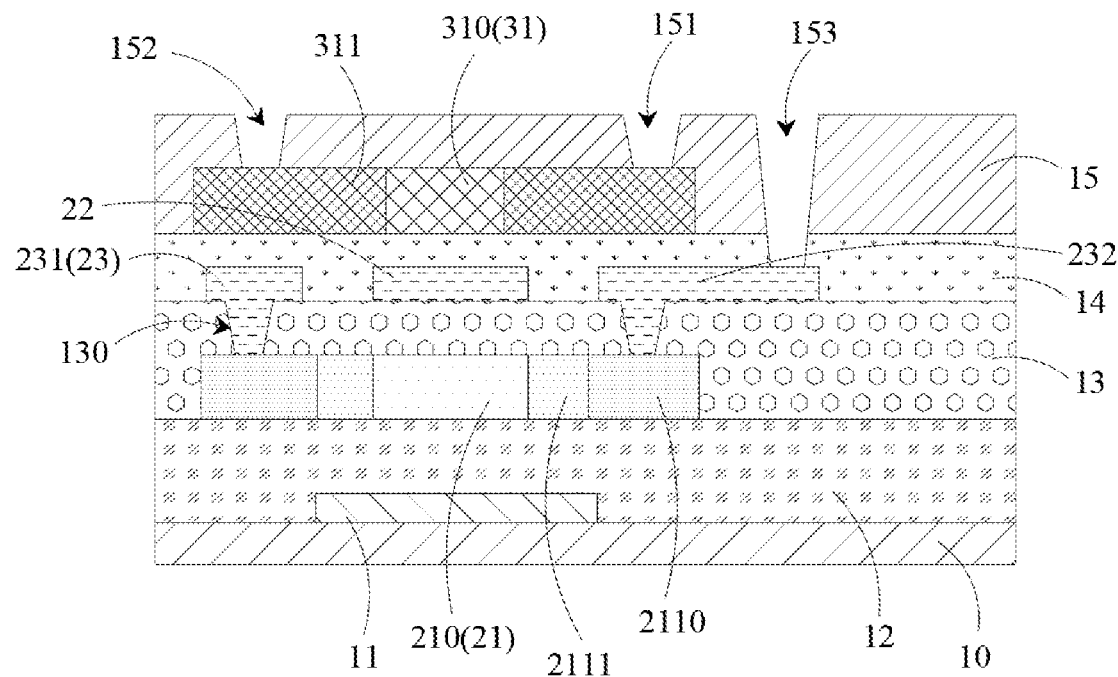

As shown in FIG. 7i, which is a cross-section of the vertical inverter in the direction A-A, the second source interconnect hole 153 is disposed spaced apart from the first source interconnect hole 151, passes through the third insulation layer 15 and the second insulation layer 14, and exposes a side surface of the auxiliary electrode 23 away from the insulation substrate 10.

Figure 7J:
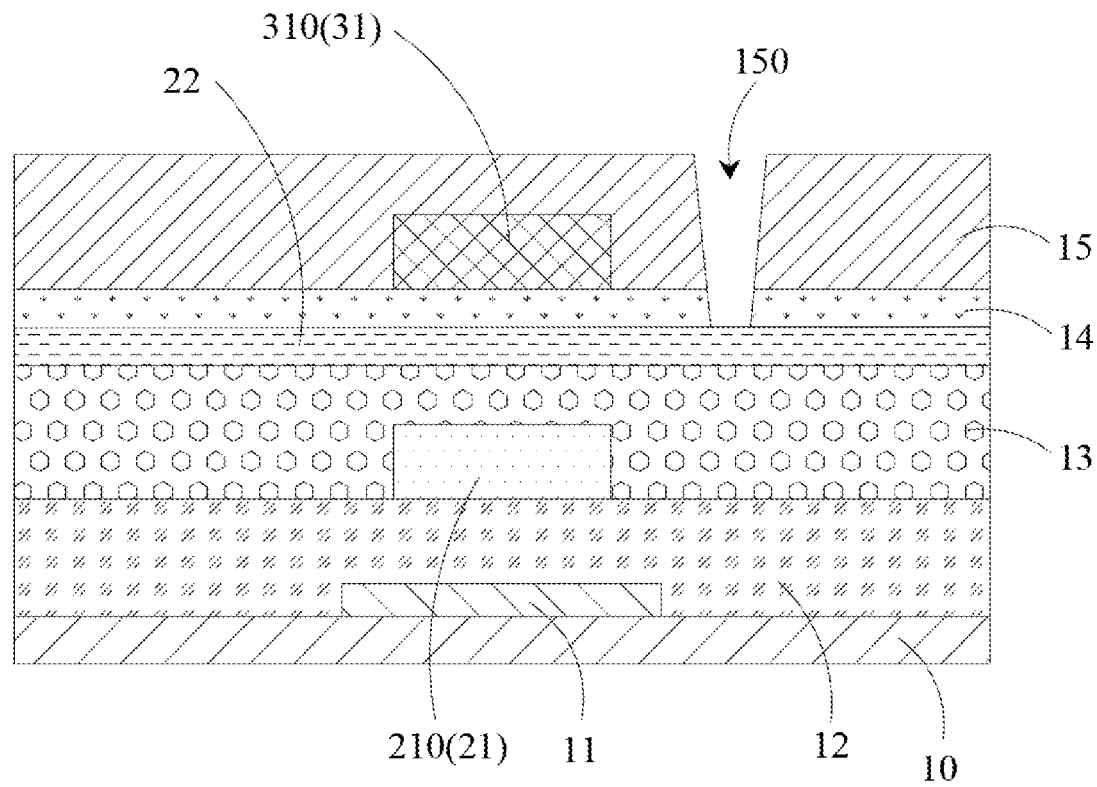

As shown in FIG. 7j, which is a cross-section of the vertical inverter in the direction B-B, the gate interconnect hole 150 passes through the third insulation layer 15 and the second insulation layer 14, and exposes the side surface of the bottom gate 22 away from the insulation substrate 10.

Step S100: forming the source 33, the drain 34, and the top gate electrode 32 on the third insulation layer 15.

Step S100 may specifically include depositing a metal material on the third insulation layer 15, and etching the metal material to form the source 33, the drain 34, and the top gate electrode 32.

Figure 7K:
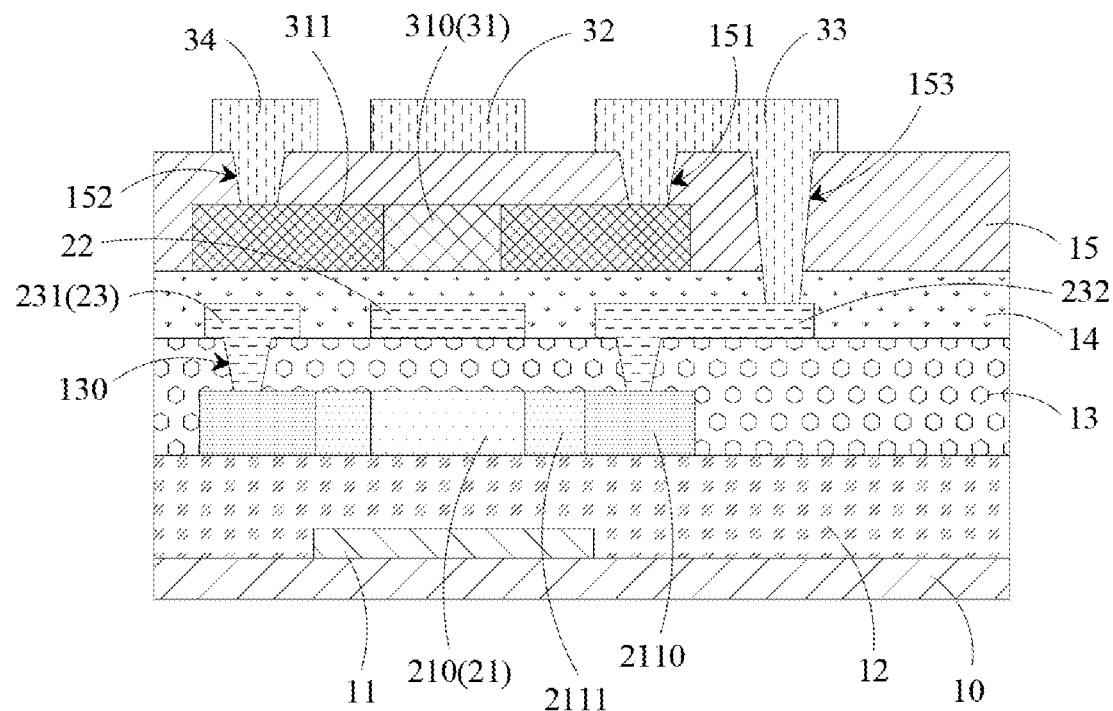

As shown in FIG. 7k, FIG. 7k shows a cross section of the vertical inverter in the direction the A-A, the drain 34 contacts a corresponding one of the P-type doped regions 311 through the drain interconnect hole 152. A part of the source 33 contacts another one of the P-type doped regions 311 through the first source interconnect hole 151, and another part of the source 33 contacts a corresponding one of the auxiliary electrodes 23 through the second source interconnect hole 153.

Figure 7L:
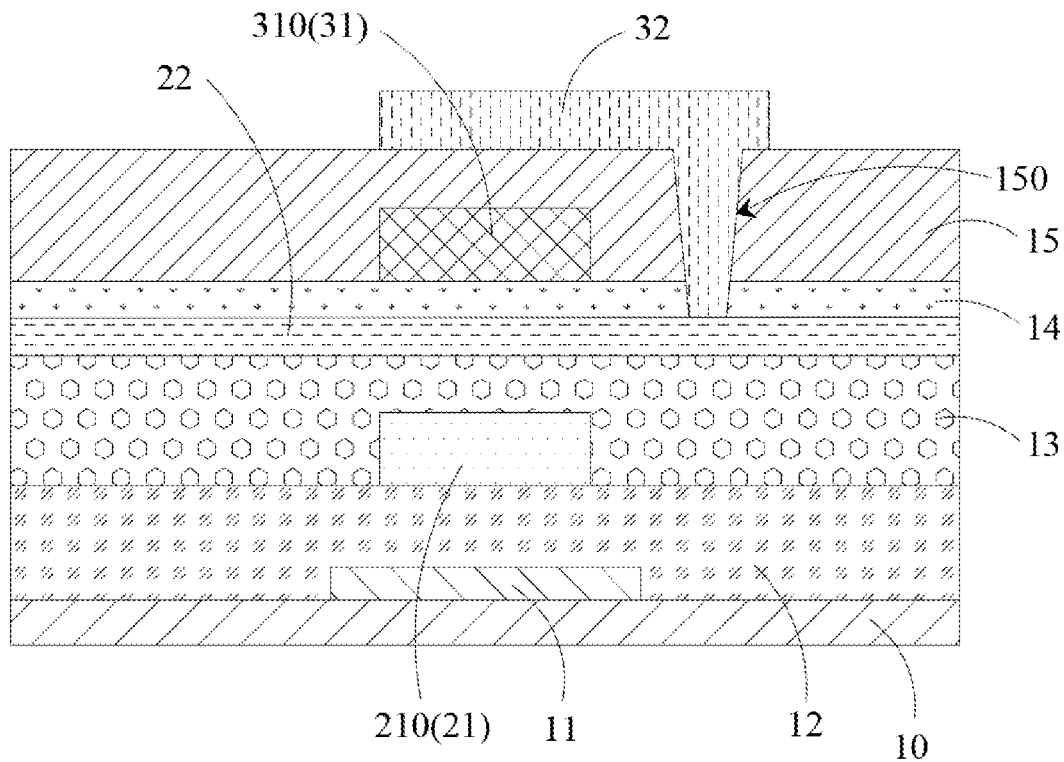

As shown in FIG. 7l, FIG. 7l shows a cross-section of the vertical inverter in the direction B-B, and the top gate 32 contacts the side surface of the bottom gate 22 away from the insulation substrate 10 through the gate interconnect hole 150.

It should be noted that, the method of manufacturing the vertical inverter is described above according to an embodiment of the present disclosure. If the method of manufacturing the vertical inverter is applied to a process of manufacturing the display panel, any step in the method of manufacturing the vertical inverter according to an embodiment of the present disclosure may be inserted into manufacturing steps of the display panel, and this is not limited herein.

It should also be noted that the manufacturing method according to an embodiment of the present disclosure is illustrated merely by taking the first vertical inverter shown in FIG. 3 and FIG. 4 as an example. For the method of manufacturing the vertical inverter according to other embodiments of the present disclosure, reference may be made to the method of manufacturing the vertical inverter according to one of the above embodiments, and details are not described herein.

In accordance with the vertical inverter according to one of the above embodiments of the present disclosure, an embodiment of the present disclosure further provides a semiconductor device, which may include the vertical inverter according to one of the above embodiments.

In one embodiment, the semiconductor device may be an integrated circuit (IC) in which circuits such as a pixel driving circuit, a gate driving circuit, a source driving circuit, a timing controller, and/or the like may be integrated. The vertical inverter may be applied to at least one of the driving circuits described above, so that more thin film transistors may be arranged within a limited space. Therefore, the integration degree and the circuit performance of the thin film transistors in the integrated circuit may be improved, thereby integrating IC circuit on a glass substrate of the display panel.

In one embodiment, the semiconductor device may also be a display panel, and the vertical inverter may be applied to circuits such as a pixel driving circuit, a gate driving circuit, a source driving circuit, a timing controller, and/or the like within the display panel, so that more thin film transistors may be arranged within the limited space, thereby improving the integration degree of the thin film transistors in the display panel.

One of advantageous effects of embodiments of the present disclosure: an embodiment of the present disclosure provides a vertical inverter and a semiconductor device including the vertical inverter, and the vertical inverter includes an insulation substrate, a first thin film transistor and a second thin film transistor, wherein the first thin film transistor includes a first active layer including a first channel region and N-type doped regions disposed on opposite sides of the first channel region, wherein the second thin film transistor is disposed on one side of the first thin film transistor away from the insulation substrate, and the second thin film transistor includes a second active layer including a second channel region and P-type doped regions disposed on opposite sides of the second channel region, wherein one of the P-type doped regions in the second active layer is electrically connected to a corresponding one of the N-type doped regions in the first active layer, and wherein by a layered arrangement of the first and second thin film transistors of the vertical inverter, more thin film transistors can be arranged within the limited space, so that the integration degree of the thin film transistors in the semiconductor device can be improved.

In sum, although the present disclosure has been disclosed in preferred embodiments, the above preferred embodiments are not intended to limit the present disclosure. Those of ordinary skill in the art may make various changes and modifications without departing from the spirit and scope of the present disclosure. Therefore, the scope of the present disclosure is based on the scope defined in claims.

What is claimed is:

1. A vertical inverter comprising:
   an insulation substrate;
   a first thin film transistor disposed on the insulation substrate, wherein the first thin film transistor comprises a first active layer comprising a first channel region and N-type doped regions disposed on opposite sides of the first channel region;
   a second thin film transistor disposed on a side of the first thin film transistor away from the insulation substrate, wherein the second thin film transistor comprises a second active layer, a source, and a drain, wherein the second active layer comprises a second channel region and P-type doped regions disposed on opposite sides of the second channel region, wherein one of the P-type doped regions in the second active layer is electrically connected to a corresponding one of the N-type doped regions in the first active layer, and wherein one of the source and the drain is electrically connected to one of the P-type doped regions in the second active layer and one of the N-type doped regions in the first active layer;
   a first insulation layer disposed between the first active layer and the second active layer, wherein the first thin film transistor further comprises at least one auxiliary electrode disposed between the first insulation layer and the second active layer, and the at least one auxiliary electrode passes through the first insulation layer and contacts a corresponding one of the N-type doped regions;
   a second insulation layer disposed between the at least one auxiliary electrode and the second active layer; and
   a third insulation layer disposed on a side of the second active layer away from the second insulation layer,
   wherein the source and the drain are disposed on a side of the third insulation layer away from the second insulation layer, and
   wherein one of the source and the drain sequentially passes through the third insulation layer, a corresponding one of the P-type doped region, and the second insulation layer, and the source and the drain contact the at least one auxiliary electrode and one of the P-type doped regions, respectively.

2. The vertical inverter of claim 1, wherein the first thin film transistor comprises a bottom gate, and the bottom gate is disposed between the first active layer and the second active layer and disposed in alignment with the first channel region and the second channel region, respectively.

3. The vertical inverter of claim 2, wherein a length of the second channel region in a direction from one of the P-doped regions on one side of the second channel region toward one of the P-doped regions on opposite side is smaller than a length of the bottom gate in the direction.

4. The vertical inverter of claim 1, wherein the second thin film transistor comprises a top gate, and the top gate is disposed on a side of the second active layer away from the first active layer, and the top layer gate is disposed in alignment with the second channel region.

5. The vertical inverter of claim 4, wherein a length of the second channel region in a direction from one of the P-doped regions on one side of the second channel region toward one of the P-doped regions on opposite side is smaller than a length of the top gate in the direction.

6. The vertical inverter of claim 1, wherein a length of the second channel region in a direction from one of the P-doped regions on one side of the second channel region toward one of the P-doped regions on opposite side is smaller than a length of the first channel region in the direction.

7. The vertical inverter of claim 1, wherein a length of each of the P-type doped regions in a direction from one of the P-doped regions on one side of the second channel region toward one of the P-doped regions on opposite side is greater than a length of each of the N-type doped regions in the direction.

8. A vertical inverter comprising:
   an insulation substrate;
   a first thin film transistor disposed on the insulation substrate, wherein the first thin film transistor comprises a first active layer comprising a first channel region and N-type doped regions disposed on opposite sides of the first channel region;
   a second thin film transistor disposed on a side of the first thin film transistor away from the insulation substrate, wherein the second thin film transistor comprises a second active layer, a source, and a drain, wherein the second active layer comprises a second channel region and P-type doped regions disposed on opposite sides of the second channel region, wherein one of the P-type doped regions in the second active layer is electrically connected to a corresponding one of the N-type doped regions in the first active layer, and wherein one of the source and the drain is electrically connected to one of the P-type doped regions in the second active layer and one of the N-type doped regions in the first active layer;
   a first insulation layer disposed between the first active layer and the second active layer, wherein the first thin film transistor further comprises at least one auxiliary electrode disposed between the first insulation layer and the second active layer, and the at least one auxiliary electrode passes through the first insulation layer and contacts a corresponding one of the N-type doped regions;
   a second insulation layer disposed between the at least one auxiliary electrode and the second active layer; and
   a third insulation layer disposed on a side of the second active layer away from the second insulation layer, wherein the source and the drain are disposed on a side of the third insulation layer away from the second insulation layer,
   wherein a portion of one of the source and the drain passes through the third insulation layer and contacts one of the P-type doped regions, and another portion of one of the source and the drain sequentially passes through the third insulation layer and the second insulation layer and contacts the at least one auxiliary electrode.

9. The vertical inverter of claim 1, wherein the first thin film transistor comprises a bottom gate, and the bottom gate is disposed in the same layer as the at least one auxiliary electrode and of the same material as the bottom gate.

10. The vertical inverter of claim 9, wherein the second thin film transistor comprises a top gate and the top gate is disposed in the same layer as the source and the drain and of the same material as the source and the drain.

11. The vertical inverter of claim 10, wherein the bottom gate is of a different material from the top gate.

12. The vertical inverter of claim 11, wherein the top gate contacts the bottom gate through an insulation layer between the top gate and the bottom gate.

13. A semiconductor device comprising a vertical inverter, the vertical inverter comprising:
an insulation substrate;
a first thin film transistor disposed on the insulation substrate, wherein the first thin film transistor comprises a first active layer comprising a first channel region and N-type doped regions disposed on opposite sides of the first channel region;
a second thin film transistor disposed on a side of the first thin film transistor away from the insulation substrate, wherein the second thin film transistor comprises a second active layer, a source, and a drain, wherein the second active layer comprises a second channel region and P-type doped regions disposed on opposite sides of the second channel region, wherein one of the P-type doped regions in the second active layer is electrically connected to a corresponding one of the N-type doped regions in the first active layer, wherein one of the source and the drain is electrically connected to one of the P-type doped regions in the second active layer and one of the N-type doped regions in the first active layer;
a first insulation layer disposed between the first active layer and the second active layer, wherein the first thin film transistor further comprises at least one auxiliary electrode disposed between the first insulation layer and the second active layer, and the at least one auxiliary electrode passes through the first insulation layer and contacts a corresponding one of the N-type doped regions;
a second insulation layer disposed between the at least one auxiliary electrode and the second active layer;
a third insulation layer disposed on a side of the second active layer away from the second insulation layer, wherein the source and the drain are disposed on a side of the third insulation layer away from the second insulation layer;
wherein one of the source and the drain sequentially passes through the third insulation layer, one of the P-type doped region, the second insulation layer, and the first insulation layer, and contacts the one of the P-type doped regions and the N-type doped region, respectively.

14. The semiconductor device of claim 13, wherein the first thin film transistor comprises a bottom gate, and the bottom gate is disposed between the first active layer and the second active layer and disposed in alignment with the first channel region and the second channel region, respectively.

15. The semiconductor device of claim 14, wherein a length of the second channel region in a direction from one of the P-doped regions on one of the opposite sides of the second channel region toward one of the P-doped regions on the other side of the opposite sides is smaller than a length of the bottom gate in the direction.

16. The semiconductor device of claim 13, wherein the second thin film transistor comprises a top gate, and the top gate is disposed on a side of the second active layer away from the first active layer, and the top layer gate is disposed in alignment with the second channel region.

* * * * *